US009949361B1

(12) United States Patent
Vaisman

(10) Patent No.: US 9,949,361 B1
(45) Date of Patent: Apr. 17, 2018

(54) GEOMETRICALLY INVERTED ULTRA WIDE BAND MICROSTRIP BALUN

(71) Applicant: Scientific Components Corporation, Brooklyn, NY (US)

(72) Inventor: Aaron Vaisman, Brooklyn, NY (US)

(73) Assignee: Scientific Components Corporation, Brooklyn, NY (US)

( * ) Notice: Subject to any disclaimer, the term of this patent is extended or adjusted under 35 U.S.C. 154(b) by 51 days.

(21) Appl. No.: 15/146,577

(22) Filed: May 4, 2016

Related U.S. Application Data

(60) Provisional application No. 62/159,002, filed on May 8, 2015.

(51) Int. Cl.
| | | |
|---|---|---|
| *H03H 7/42* | (2006.01) | |
| *H05K 1/02* | (2006.01) | |
| *H05K 1/11* | (2006.01) | |
| *H01P 5/10* | (2006.01) | |
| *H01P 5/08* | (2006.01) | |
| *H01P 5/19* | (2006.01) | |
| *H01P 3/08* | (2006.01) | |

(52) U.S. Cl.
CPC .......... *H05K 1/0242* (2013.01); *H01P 5/085* (2013.01); *H01P 5/10* (2013.01); *H01P 5/19* (2013.01); *H05K 1/115* (2013.01); *H05K 2201/09809* (2013.01)

(58) Field of Classification Search
CPC . H01P 5/10; H01P 5/1007; H01P 3/08; H03H 7/42
USPC .............................................. 333/25, 26, 238
See application file for complete search history.

(56) References Cited

U.S. PATENT DOCUMENTS

| | | | | | |
|---|---|---|---|---|---|
| 5,025,232 | A * | 6/1991 | Pavio | ........................ | H01P 5/10 333/238 |
| 6,201,439 | B1 * | 3/2001 | Ishida | ........................ | H01P 5/10 330/124 R |
| 7,471,167 | B2 * | 12/2008 | Kim | ........................ | H01P 5/10 333/238 |
| 7,772,941 | B2 * | 8/2010 | Yeung | ................... | H01P 5/1015 333/238 |
| 8,076,993 | B2 * | 12/2011 | Hamada | ................... | H01P 5/10 333/128 |

(Continued)

OTHER PUBLICATIONS

Jong-Sik Lim, et al., A 800- to 3200-MHz Wideband CPW Balun Using Multistage Wilkinson Structure, conference paper, IEEE MTT-S International Microwave Symposium, Jul. 2006, pp. 1141-1144, Division of Information Technology Engineering, Korea.

*Primary Examiner* — Dean Takaoka
(74) *Attorney, Agent, or Firm* — Lawrence G. Fridman, Esq.; Feigin & Fridman, LLC

(57) ABSTRACT

A balun device comprises an input microstrip, a first output microstrip, a second output microstrip, and a junction comprising a conductive termination of the input microstrip, the first output microstrip, and the second output microstrip, whereby an input signal provided to the input microstrip will propagate through the first output microstrip as a first output signal and through the second output microstrip as a second output signal, wherein the phase of the first output signal is identical to the phase of the input signal, and wherein the junction inverts the phase of the second output signal relative to the phase of the input signal and the first output signal.

19 Claims, 4 Drawing Sheets

(56) References Cited

U.S. PATENT DOCUMENTS

| | | | |
|---|---|---|---|
| 8,207,797 B2* | 6/2012 | Wu | H01P 5/10 |
| | | | 333/238 |
| 8,471,645 B2* | 6/2013 | Ujita | H01P 5/10 |
| | | | 333/238 |
| 9,692,387 B2* | 6/2017 | Simon | H03H 7/42 |

* cited by examiner

GEOMETRICALLY INVERTED ULTRA WIDE BAND MICROSTRIP BALUN

RELATED APPLICATIONS

This patent application claims the benefit under 35 USC 119(e) of U.S. Provisional Patent Application No. 62/159,002, filed on May 8, 2015 and entitled "Geometrically Inverted Ultra Wide Band Microstrip Balun", the entirety of which is incorporated herein by reference.

FIELD OF THE INVENTION

The present invention relates to baluns in general, and more particularly to ultra wide band microstrip baluns.

DESCRIPTION OF THE PRIOR ART

A balun is a well-known type of electronic device that transforms a high frequency signal between a signal suitable for a balanced transmission line and a signal suitable for an unbalanced transmission line. A balun converts balanced impedance to unbalanced impedance, and unbalanced impedance to balanced impedance. The two ports of the balun are referred to as the unbalanced port (a terminal referenced to ground) and the balanced port (two terminals, one referenced to the other). Applications for balun components include circuitry for splitting and combining signals, and other circuitry where transformation from balanced to unbalanced signals is required.

In high frequency circuits, conductive paths may be referred to as transmission lines, wherein every circuit portion at high frequencies has electromagnetic effects that must be taken into account. One common form of transmission line is the coplanar waveguide, (CPW) wherein a single conductive trace is formed on a dielectric substrate, together with a pair of return conductors, one to either side of the trace. All three conductors are parallel and on the same side of the substrate, and hence are coplanar. The return conductors are separated from the central trace by a small insulating gap, which has an unvarying width along the length of the line. Away from the center trace, the return conductors usually extend to an indefinite but large distance, so that each is notionally a semi-infinite plane. The coplanar waveguide is easily fabricated in a variety of media, including printed circuit boards, integrated circuits, and hybrid devices. One distinct advantage of the coplanar waveguide is that since all three conductors are coplanar, it is particularly easy to form in a metallization layer of an integrated circuit.

A particular coplanar waveguide balun is disclosed in the paper "A 800- to 3200-MHz Wideband CPW Balun Using Multistage Wilkinson Structure", IEEE 2006. This balun uses a well-known multistage Wilkinson divider topology, but adds phase inversion to one output leg via geometric inversion of the CPW traces. Two pairs of X-shaped structures are used to invert the center trace to be the return conductors, and the return conductors to be the center trace. This reduces the overall size of the balun, but in order to realize a wide bandwidth, multiple Wilkinson stages are needed and thus the overall device is still of significant size. Due to this crossing of conductors, vias and a second conductive layer are needed, which adds significant complexity to realizing this structure as an integrated circuit. Further, as an integrated circuit this CPW balun structure can only handle very limited wattage.

Another form of transmission line is the microstrip, which is often the preferred means of realizing a transmission line on a printed circuit board (pcb) by taking advantage of easily available two-sided metallization and simple conductive vias for throughput between the metal layers. One advantage of printed circuit boards over some of the more miniaturized forms of circuitry includes the ability to handle extremely high levels of power, up to hundreds of watts. A more capable ultra wide band balun could be realized with a microstrip-based divider or power splitter circuit, thus also providing very high power handling capability, when realized on a pcb.

SUMMARY OF THE INVENTION

A balun device comprises an input microstrip, a first output microstrip, a second output microstrip, and a junction comprising a conductive termination of the input microstrip, the first output microstrip, and the second output microstrip, whereby an input signal provided to the input microstrip will propagate through the first output microstrip as a first output signal and through the second output microstrip as a second output signal, wherein the phase of the first output signal is identical to the phase of the input signal, and wherein the junction inverts the phase of the second output signal relative to the phase of the input signal and the first output signal.

According to another aspect of the present invention, the input microstrip comprises a first narrow conductor, a first broad conductor, and a planar insulator therebetween, the first output microstrip comprises a second narrow conductor, the first broad conductor, and the planar insulator therebetween, the second output microstrip comprises a third narrow conductor, a second broad conductor, and the planar insulator therebetween, wherein the first narrow conductor, the second narrow conductor, and the second broad conductor are disposed on a first face of the planar insulator, wherein the first broad conductor and the third narrow conductor are disposed on a second face of the planar insulator, wherein the junction further comprises a conductive termination of the first narrow conductor, the second narrow conductor, and the third narrow conductor, wherein the first broad conductor and the second broad conductor are in electrical communication, and whereby the second output signal is present on the second broad conductor, and wherein the balun device is formed on a printed circuit board, (pcb) has a bandwidth of at least 4 MHz to 3,300 MHz, has a phase tolerance better than or equal to +/−10 degrees at that bandwidth, and has a power range of at least 100 watts.

According to yet another aspect of the present invention, conductive vias provide electrical communication of the junction between the first face and the second face of the planar insulator, and conductive vias provide electrical communication between the first broad conductor and the second broad conductor, and the balun further comprises a first coaxial connector having a centrally disposed first inner conductor and a radially disposed first outer conductor, and further comprises the first inner conductor in electrical communication with the first narrow conductor, wherein the first outer conductor is in electrical communication with the first broad conductor, and further comprises a second coaxial connector having a centrally disposed second inner conductor and a radially disposed second outer conductor, wherein the second inner conductor is in electrical communication with the second narrow conductor and the second outer conductor is in electrical communication with the first broad conductor, and further comprises a third coaxial connector having a centrally disposed third inner conductor and a radially disposed third outer conductor, wherein the third inner conductor is in electrical communication with the second broad conductor and the third outer conductor is in electrical communication with the third narrow conductor, and whereby the first output signal is present on the second inner conductor and the second output signal is present on the third inner conductor.

According to still another aspect of the present invention, the balun device further comprises an enclosure enclosing at least the majority of the balun device, wherein the coaxial connectors are attached to the enclosure in order to provide mechanical anchoring of the coaxial connectors, wherein the enclosure comprises at least mostly conductive material and preferably at least one insulator, wherein the insulator is interposed between the coaxial connectors and the enclosure, thereby electrically isolating the coaxial connectors from the enclosure.

According to a further aspect of the present invention, the junction comprises a T-junction approximately orthogonal, the input microstrip and the second output are approximately orthogonal, and the first output microstrip and the second output microstrip are approximately collinear, and wherein the first broad conductor and the second broad conductor are each bounded diagonally along an edge, and wherein the diagonal boundaries are approximately parallel and have sufficient overlap to encompass the vias between the first broad conductor and the second broad conductor, the diagonal boundaries are in proximity to the junction and the diagonal boundaries are insulated from said junction.

According to a yet further aspect of the present invention, a T-junction is formed on a printed circuit board (pcb), having through plated vias and an input signal trace on a first surface of the pcb, terminating at the T-junction and at a first input port, and a reference plane on a second surface of the pcb, which in combination with the input signal trace forms an input microstrip and a first output signal trace on the first surface of the pcb, terminating at the T-junction and at a first output port, wherein the first output signal trace and the reference plane in combination form a first output microstrip, and wherein a second output microstrip is formed with a physical inversion of a portion of the reference plane, the inverted portion of the reference plane being brought to the first surface of the pcb, and a second output signal trace being brought to the second surface of the pcb, wherein the second output signal trace terminates at the T-junction and at a second output end, whereby a region of the inverted portion of the reference plane adjacent to the second output end functions as a second output port, and the second output end functions as a second output reference, and wherein by the configuration of the second output microstrip, the functionality of the second output signal trace and the inverted portion of said reference plane are physically mirrored or reversed, and wherein by the reversal in the functionality of the second output signal trace and the inverted portion of the reference plane, orientation of the electromagnetic fields at the second output port is opposed by 180 degrees in phase with respect to the orientation of the electromagnetic fields at the first output port, and wherein the reversal assures that a signal is split in two different paths and the inversion of the phase of 180 degrees between the first and second output ports is achieved.

According to a still further aspect of the present invention, the first output microstrip and the second output microstrip have approximately identical length and area, the input microstrip and the first output microstrip are approximately orthogonal, the input microstrip and the second output are approximately orthogonal, and the first output microstrip and the second output microstrip are approximately collinear, and the reference plane and the inverted portion of the reference plane are each bounded diagonally along an edge, the diagonal boundaries are approximately parallel, the diagonal boundaries are in proximity to the T-junction, and the diagonal boundaries are insulated from the T-junction.

According to an additional aspect of the present invention, the balun device has a bandwidth of at least 4 MHz to 3,300 MHz, a phase tolerance of at least +/−10 degrees at that bandwidth, and a power range of at least 100 watts.

BRIEF DESCRIPTION OF THE DRAWINGS

The present version of the invention will be more fully understood with reference to the following Detailed Description in conjunction with the drawings of which.

DESCRIPTION OF THE PREFERRED EMBODIMENTS

Figure 1:
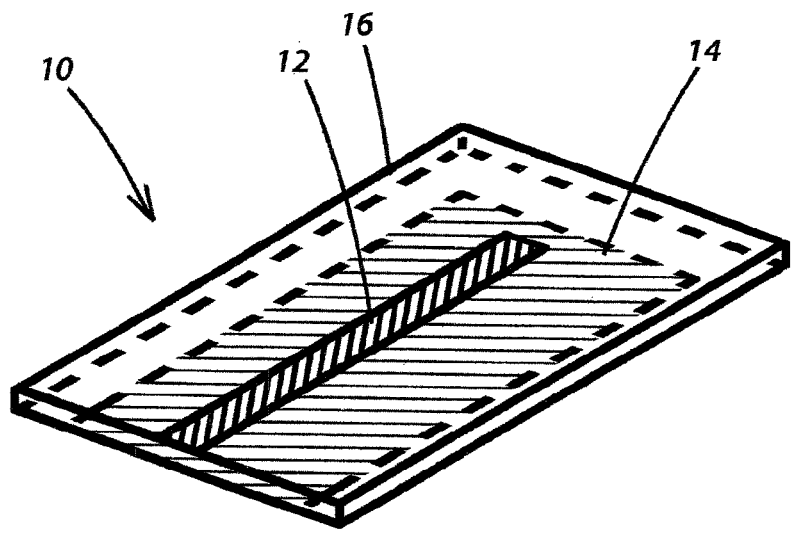
FIG. 1 shows an exemplary microstrip.

FIG. 1 shows an exemplary microstrip 10. The microstrip 10 is formed from a narrow signal trace 12 located over a broad reference plane 14. Generally the reference plane 14 is a ground plane. The width ratio between the signal trace and the reference plane is dependent on numerous geometric factors, but in general the width ratio is at least in the range of 1:4 to 1:10. Both the signal trace 12 and the reference plane 14 are formed from electrically conductive material, typically copper, silver, gold, or aluminum, although other conductive materials may be employed, and are separated by a relatively thin planar insulator 16, typically fiberglass, polymer, or ceramic, although other insulating materials may be employed, generally known as the substrate. Typically the microstrip 10 is fabricated on a pcb. Microstrips are used to transmit high frequency electrical signals including microwave signals, often between circuit elements, and may function as circuit elements too.

Figure 2:
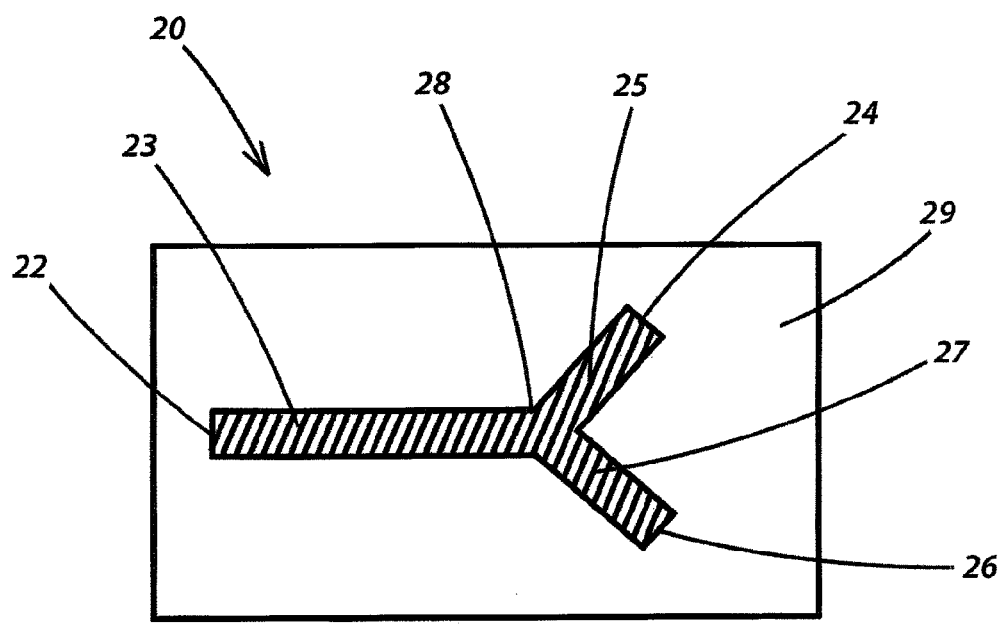
FIG. 2 shows an exemplary microstrip based splitter.

A common high frequency circuit element is a splitter, which is a 3-port device which serves to split a signal along two separate conductive paths. FIG. 2 shows a splitter 20 realized in microstrip form. As shown herein only the signal trace portion is visible, although it is understood that the opposite side contains a reference plane. A signal is input at an input port 22, travels through the input signal trace 23, and is split at a junction 28 so that equal signals travel through a first output trace 25 and a second output trace 27, and are then output at a first output port 24 and a second output port 26. As with other microstrip devices, there is a substrate 29, and a ground or reference plane, which is on the underside of the splitter 20 but not depicted herein. The signals at the input port 22, first output port 24, and second output port 26 all have identical phase. If the microstrip splitter 20 had a means for inverting the phase of one output port, then it would function as a balun.

Figure 3A:
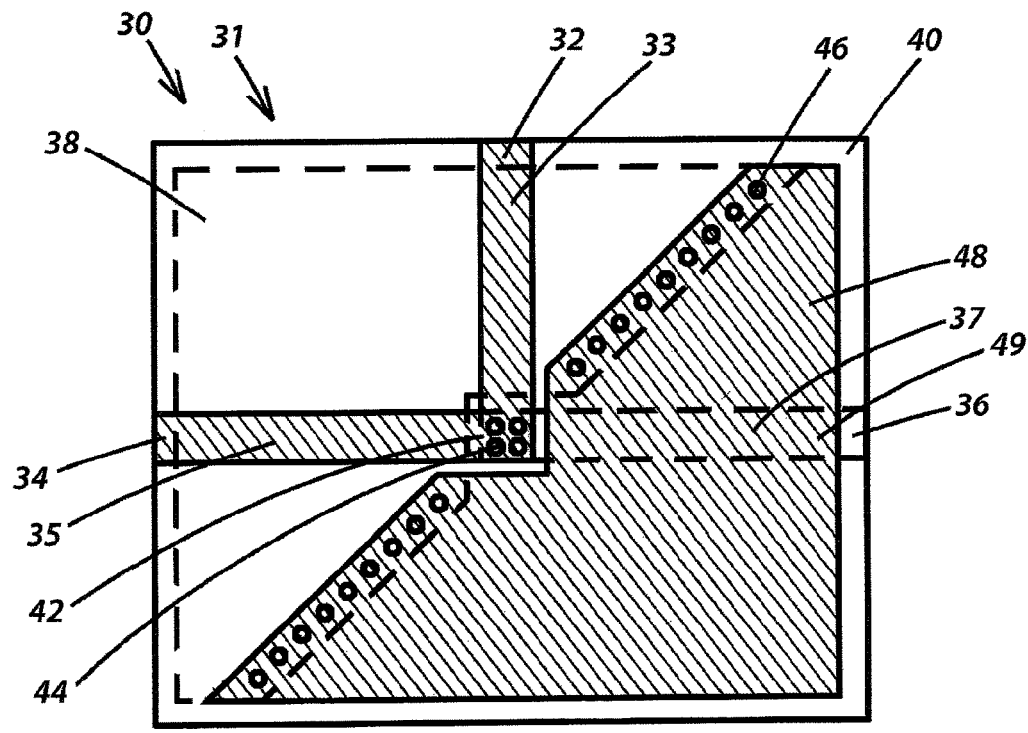
FIG. 3a shows the first side metallization of a balun device from a first view.
Figure 3B:
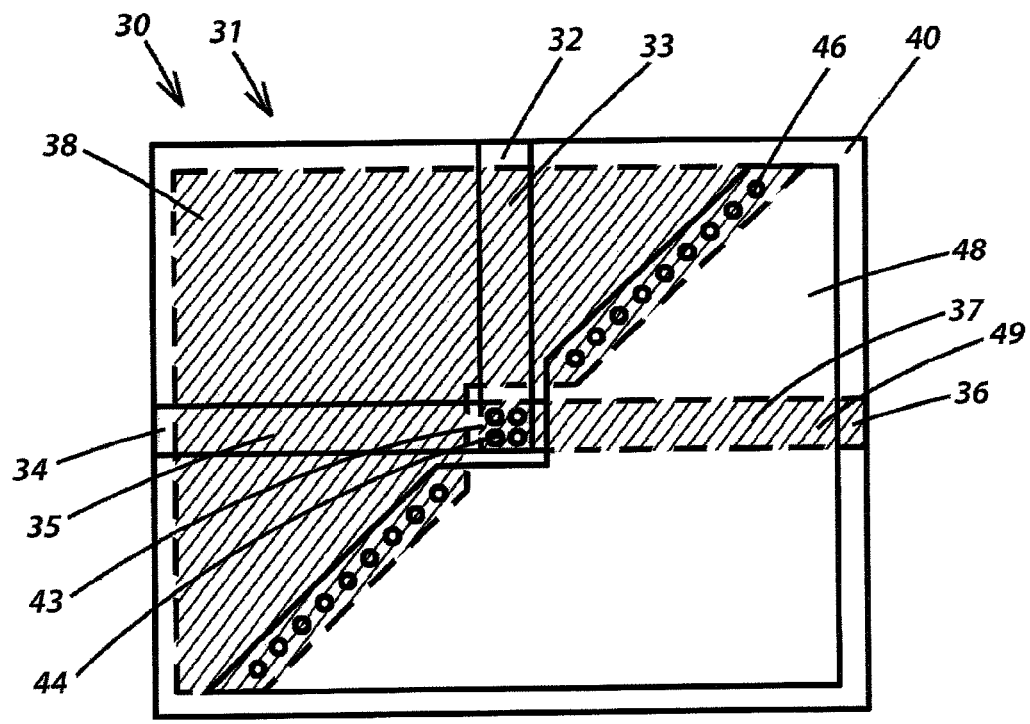
FIG. 3b shows the second side metallization of a balun device from a first view.

FIGS. 3a-3b show a preferred embodiment balun 30. FIG. 3a shows a "top side" view of the balun 30 with the "top side" conductive areas hatched, and FIG. 3b shows a "top side" view of the balun 30 with the "bottom side" conductive areas hatched. As previously discussed, a microstrip comprises a narrow conductive circuit trace and a broad ground or reference plane, separated by a planar insulator as a substrate. An input port 32 feeds into an input narrow trace 33 which is electrically connected to a first output narrow trace 35 through a first junction 42 on the top or first side of a pcb 31. An insulating substrate 40 forms the planar insulator core of the pcb 31 between the top and bottom metallizations. A first reference plane 38 underlies the input narrow trace 33 and the first output narrow trace 35 on the bottom or second side of the pcb 31, thus forming two microstrips. A signal input to the input port 32 will be measured as having identical phase at the first output port 34, which is fed through the first output narrow trace 35. A second output narrow trace 37 is disposed on the bottom or second side of the pcb 31, and is preferably equal in length and area to the first output narrow trace 35. A second reference plane 48 overlays the second output narrow trace 37 on the first side of the pcb 31, thus forming a third microstrip, however with the signal trace and the reference plane inverted relative to the other two microstrips. The second output narrow trace 37 is terminated at a second junction 43 on the bottom or second side of the pcb 31, and terminates at a second output end 36. The first junction 42 and second junction 43 are preferably of identical dimensions and vertically aligned through the pcb 31. The first junction 42 and second junction 43 are electrically connected through the pcb substrate 40 by junction vias 44. The three microstrips feed into the two junction regions which in combination with the junction vias 44 can be seen as forming a T-junction. Preferably, the input microstrip and the first output microstrip are approximately orthogonal the input microstrip and the second output microstrip are approximately orthogonal, and the first output microstrip and the second output microstrip are approximately collinear. The first reference plane 38 and second reference plane 48 overlap on a diagonal, just sufficiently to permit reference plane vias 46 to provide electrical connection between the reference planes. Configuring the reference planes on a diagonal permits a maximum area of the first reference plane 38 under the input narrow trace 33 and the first output narrow trace 35, while also permitting a sufficient area for the second reference plane 48 over the second output narrow trace 37. It is also generally preferred for the two output microstrips to have approximately identical length and area in order to maintain equal output amplitudes.

A signal input to the input port 32 will be measured as having identical phase at the first output port 34, and at the second output end 36. However, using the junction vias 44 to make a transition of a signal trace from the top of the pcb to the bottom of the pcb, while using the reference plane vias 46 to make a transition of a split reference plane from the bottom of the pcb 31 to the top of the pcb 31, causes a geometric inversion of the electromagnetic fields in the third microstrip as the signal trace becomes the reference and the reference becomes the signal trace. This desired result only happens at high frequencies, where signal propagation delay is a key parameter.

Thus at high frequencies, when the second output end 36 is used as a reference and the portion of the second reference plane 48 adjacent to the second output end 36 is used as a second output port 49, the phase of the signal at the output from the second output port 49 will be 180 degrees shifted from the phase of the signals at the input port 32 and the first output port 34.

Figure 4:
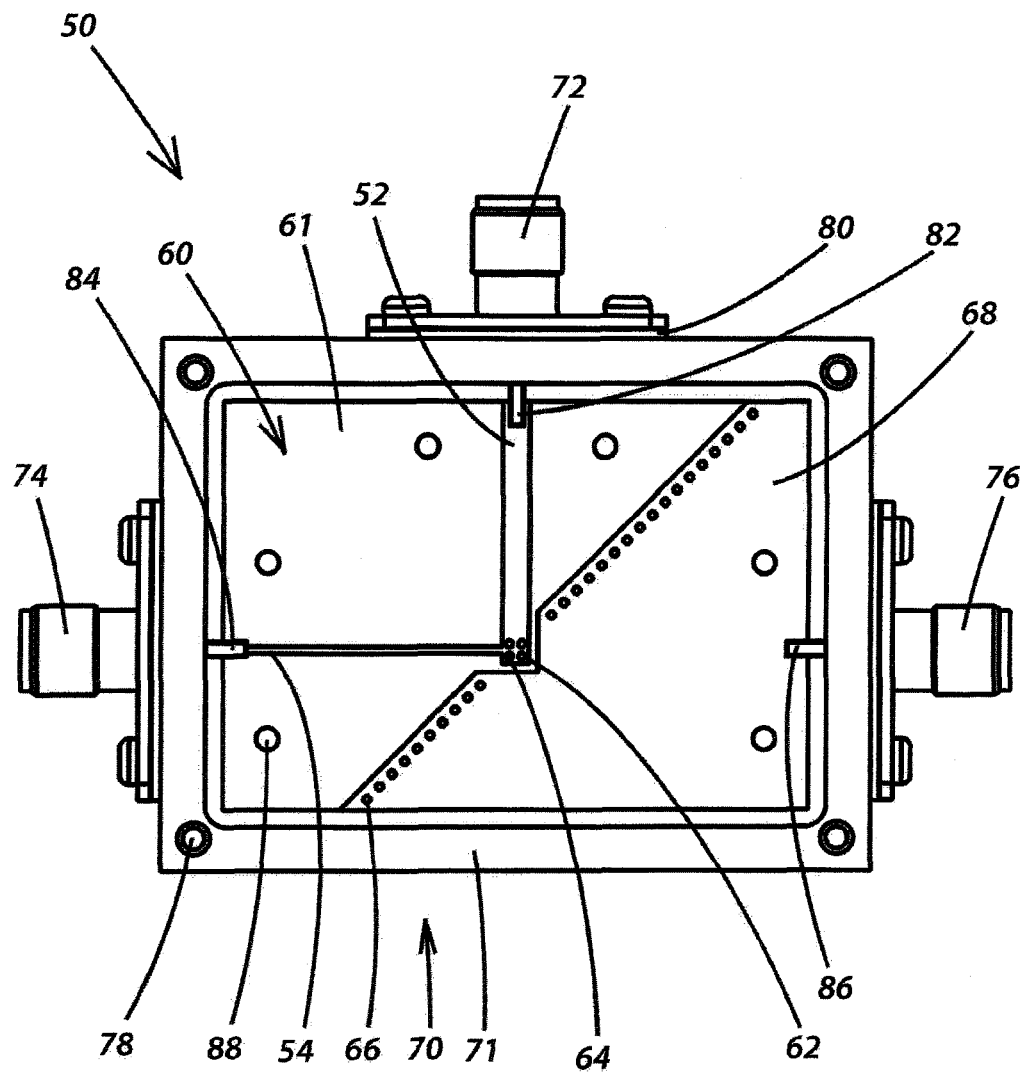
FIG. 4 shows the first side of a constructed balun device.
Figure 5:
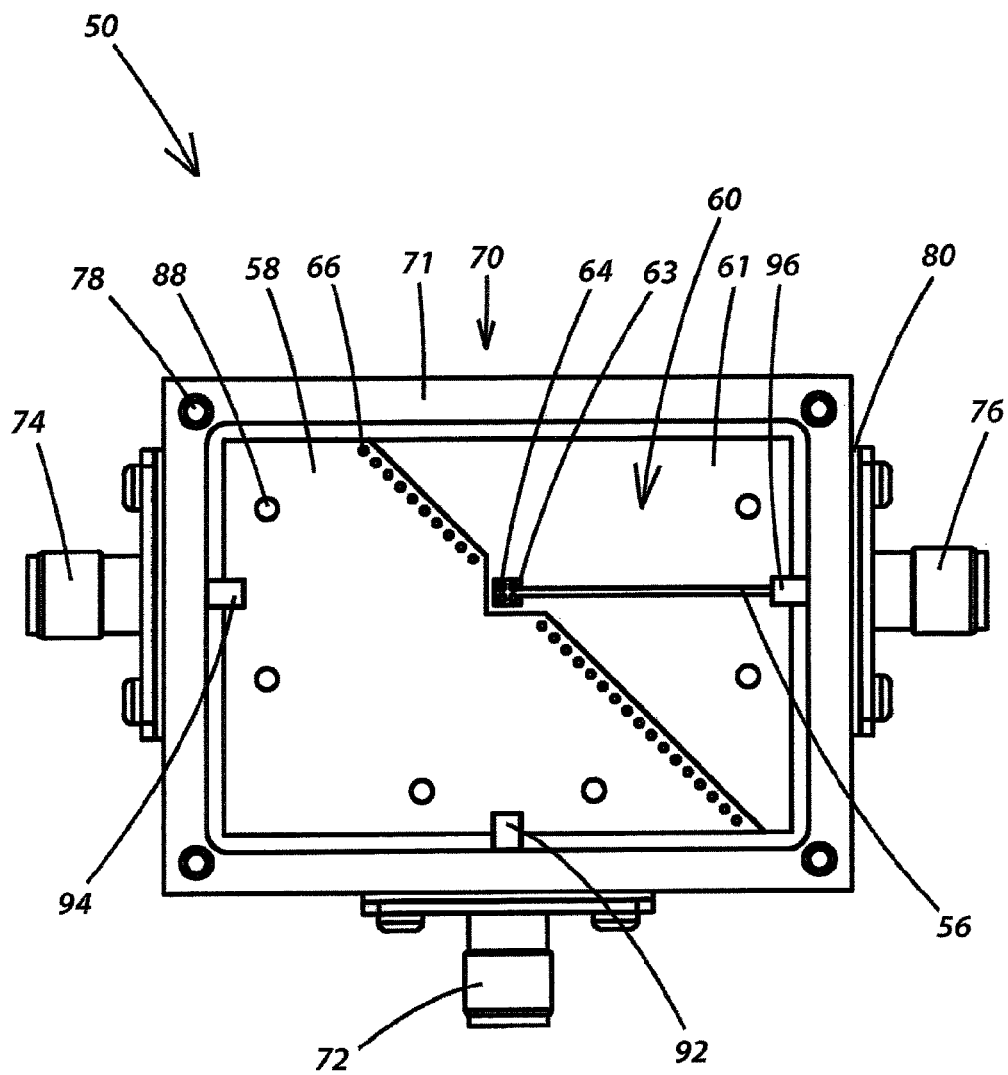
FIG. 5 shows the second side of a constructed balun device.

FIGS. 4-5 show respectively a top or first side view and a bottom or second side view of a constructed realization of a preferred embodiment balun 50. An enclosure 70 includes an enclosure shell 71 which surrounds the pcb 60 and has coaxial connectors mounted around the periphery. Each coaxial connector has a center pin generally used as a signal conductor, and a generally radially symmetrically surrounding (hence coaxial) shell generally used as a ground or reference conductor. The shell generally includes threaded, bayonet or other mechanical connection means for attaching to suitably equipped cables or other devices. Generally such cables are of coaxial construction too. An input coaxial connector 72 functions as an input port and has an input center pin 82 which is electrically connected to an input narrow trace 52. A first output coaxial connector 74 functions as a first output port and has a first output center pin 84 which is electrically connected to a first output narrow trace 54. A second output coaxial connector 76 functions as a second output port and has a second output center pin 86 which is electrically connected to a second reference plane 68. All three coaxial connectors are electrically isolated from the enclosure 70 with insulators 80. The input coaxial connector 72 also has an input shell contact 92 which is electrically connected to a first reference plane 58. The first output coaxial connector 74 also has a first output shell contact 94 which is also electrically connected to the first reference plane 58. The second output coaxial connector 76 also has a second output shell contact 96 which is electrically connected to a second output narrow trace 56. Generally, the coaxial connector center pins and shell contacts are soldered to connections on the pcb 60. Alternatively, materials such as conductive epoxy may be used to make electrical contacts. In circumstances where pins and/or contacts must be bent, trimmed or otherwise re-shaped to accommodate specific features and there may be resultant physical gaps between conductive elements, materials such as conductive epoxy may be preferable to solder. Input and output ports for the balun 50 may also be realized without coaxial connectors, with means including simply attaching wires or other conductive apparatus to the input and output portions of the balun 50. The coaxial connectors are simply a standard and convenient means for electrically connecting the balun 50 to other electronic devices. The enclosure shell 71 is preferably made of an insulating material. Covers (not shown) fit over the open faces of the enclosure shell 71 and are preferably attached via threaded holes 78. The covers are also preferably made of an insulating material.

The input narrow trace 52 is electrically connected to the first output narrow trace 34 through a first junction 62 on the top or first side of the pcb 60. A substrate 61 forms the planar insulating core of the pcb 60 between the top and bottom metallizations. The first reference plane 58 underlies the input narrow trace 52 and the first output narrow trace 54 on the bottom or second side of the pcb 60, thus forming two microstrips. A signal input to the input port 72 will be measured as having identical phase at the first output port 74. A second output narrow trace 56 is disposed on the bottom or second side of the pcb 60, and is preferably equal in length and area to the first output narrow trace 54. The second reference plane 68 overlays the second output narrow trace 56 on the first side of the pcb 60, thus forming a third microstrip, however with the signal trace and the reference plane inverted relative to the other two microstrips. The combination of the three microstrips can be seen as forming a T-junction, albeit with one output leg inverted. The second output narrow trace 56 is terminated at a second junction 63 on the bottom or second side of the pcb

60. The first junction 62 and second junction 63 are preferably of identical dimensions and vertically aligned through the pcb 60. The first junction 62 and second junction 63 are electrically connected through the pcb substrate 61 by junction vias 64. The three microstrips feed into the two junction regions which in combination with the junction vias 64 can be seen as forming a T-junction. In one of the embodiments of the invention the input microstrip and the first output microstrip are approximately orthogonal the input microstrip and the second output microstrip are approximately orthogonal, and the first output microstrip and the second output microstrip are approximately collinear. The first reference plane 58 and second reference plane 68 overlap on a diagonal, just sufficiently to permit reference plane vias 66 to provide electrical connection between the reference planes. Configuring the reference planes on a diagonal permits a maximum area of the first reference plane 58 under the input narrow trace 52 and the first output narrow trace 54, while also permitting a sufficient area for the second reference plane 68 over the second output narrow trace 56.

The signal input to the input port will be measured as having identical phase at the first output narrow trace 54, and at the second output narrow trace 56. However, using the junction vias 64 to make a transition of a signal trace from the top of the pcb 60 to the bottom of the pcb 60, while using the reference plane vias 66 to make a transition of a split reference plane from the bottom of the pcb 60 to the top of the pcb 60, causes a geometric inversion of the electromagnetic fields in the third microstrip as the signal trace becomes the reference and the reference becomes the signal trace. This desired result only happens at high frequencies, where signal propagation delay is a key parameter.

Thus at high frequencies, when the second output narrow trace 56 is used as a reference and the second reference plane 68 is used as a signal connection, the phase of the signal at the output from the second reference plane 68 and thus at the second output port 76 will be 180 degrees shifted from the phase of the signals at the input port 72 and the first output narrow trace 54 and thus the first output port 74.

For test and evaluation of the present invention, a network analyzer was connected to the input port 72, the first output port 74, and the second output port 74. Signals across an extremely wide frequency range were applied to the input port 72 and measured at the first output port 74 and the second output port 74. Due to the insulation of the coaxial connector shells from the enclosure 70, each coaxial connector is locally referenced to the associated shell contact and the portion of the balun 50 that it is in direct electrical communication with. Likewise, while all three coaxial cables connecting the coaxial connectors to the network analyzer are referenced to a system ground at the network analyzer, the high frequency inputs and outputs result in the coaxial cables functioning as transmission lines and thus none of the signals present at the balun 50 are shorted to ground.

Using the network analyzer, the balun 70 of the present invention was observed to function over an ultra wide bandwidth of 4 MHz to 3,300 MHz, while having a measured phase tolerance better than or equal to +/−10 degrees at this bandwidth. The balun 70 is also calculated to have an average power range of at least 100 watts, far more than any integrated circuit or microelectronic hybrid circuit would be capable of handling.

An alternate embodiment of the present invention may include the use of other coaxial connectors, such as SMA or other connectors which may mount directly to the pcb. Such connectors may be soldered directly to signal traces or to solder pads connected to the signal traces, and have pins which may protrude through mounting holes 88 in the pcb to solder to the reference planes or may be configured to be soldered directly to the reference planes.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention.

Accordingly, the appended claims shall not be limited by the particular features that have been shown and described, but shall be construed also to cover any obvious modifications and equivalents thereof.

What is claimed is:

1. A balun device comprising:
   an input microstrip;
   first output microstrip;
   a second output microstrip;
   a junction comprising a conductive termination of said input microstrip, said first output microstrip, and said second output microstrip, whereby an input signal provided to said input microstrip will propagate through said first output microstrip as a first output signal and through said second output microstrip as a second output signal;
   said input microstrip comprises a first narrow conductor, a first broad conductor, and a planar insulator therebetween;
   said first output microstrip comprises a second narrow conductor, said first broad conductor, and said planar insulator therebetween;
   said second output microstrip comprises a third narrow conductor, a second broad conductor, and said planar insulator therebetween;
   said first narrow conductor, said second narrow conductor, and said second broad conductor being disposed on a first face of said planar insulator;
   said first broad conductor and said third narrow conductor being disposed on a second face of said planar insulator;
   said junction further comprising a conductive termination of said first narrow conductor, said second narrow conductor, and said third narrow conductor;
   said first broad conductor and said second broad conductor being in electrical communication; and
   said second output signal is present on said second broad conductor;
      wherein the phase of said first output signal is identical to the phase of said input signal; and wherein said junction inverts the phase of said second output signal relative to the phase of said input signal and said first output signal.

2. The balun device of claim 1, being formed on a printed circuit board (pcb).

3. The balun device of claim 1, wherein conductive vias provide electrical communication of said junction between said first face and said second face of said planar insulator.

4. The balun device of claim 1, wherein conductive vias provide electrical communication between said first broad conductor and said second broad conductor.

5. The balun device of claim 4, wherein said junction comprises a T-junction;

said input microstrip and said first output microstrip are approximately orthogonal;
said input microstrip and said second output are approximately orthogonal; and
said first output microstrip and said second output microstrip are approximately collinear.

6. The balun device of claim 5, wherein:
said first broad conductor and said second broad conductor are each bounded diagonally along an edge;
said diagonal boundaries are approximately parallel and have sufficient overlap to encompass said vias between said first broad conductor and said second broad conductor;
said diagonal boundaries are in proximity to said junction; and
said diagonal boundaries are insulated from said junction.

7. The balun device of claim 1, further comprising:
a first coaxial connector having a centrally disposed first inner conductor and a radially disposed first outer conductor;
said first inner conductor in electrical communication with said first narrow conductor;
said first outer conductor in electrical communication with said first broad conductor;
a second coaxial connector having a centrally disposed second inner conductor and a radially disposed second outer conductor;
said second inner conductor in electrical communication with said second narrow conductor;
said second outer conductor in electrical communication with said first broad conductor;
a third coaxial connector having a centrally disposed third inner conductor and a radially disposed third outer conductor;
said third inner conductor in electrical communication with said second broad conductor;
said third outer conductor in electrical communication with said third narrow conductor; and
whereby said first output signal is present on said second inner conductor and said second output signal is present on said third inner conductor.

8. The balun device of claim 7, further comprising:
an enclosure enclosing at least the majority of said balun device; and
said coaxial connectors attached to said enclosure in order to provide mechanical anchoring of said coaxial connectors.

9. The balun device of claim 8, wherein said enclosure comprises substantially of an insulating material.

10. The balun device of claim 9, further comprising:
at least one insulator; and
said insulator being interposed between said coaxial connectors and said enclosure,
thereby electrically isolating said coaxial connectors from said enclosure.

11. The balun device of claim 1, wherein said device is capable of achieving beyond one decade bandwidth.

12. The balun device of claim 11, having typically a phase tolerance better than or equal to +/−10 degrees at said bandwidth.

13. The balun device of claim 1, having a power range of at least 100 watts.

14. The balun device comprising:
a T-junction formed on a printed circuit board, (pcb) having through plated vias;
an input signal trace on a first surface of said pcb, terminating at said T-junction and at a first input port;
a reference plane on a second surface of said pcb, which in combination with said input signal trace forms an input microstrip;
a first output signal trace on said first surface of said pcb, terminating at said T-junction and at a first output port;
wherein said first output signal trace and said reference plane in combination form a first output microstrip;
a second output microstrip formed with a physical inversion of a portion of said reference plane, said inverted portion of said reference plane being brought to said first surface of said pcb, and a second output signal trace being brought to said second surface of said pcb;
said second output signal trace terminating at said T-junction and at a second output end;
whereby a region of said inverted portion of said reference plane adjacent to said second output end functions as a second output port, and said second output end functions as a second output reference;
wherein by the configuration of said second output microstrip, the functionality of said second output signal trace and said inverted portion of said reference plane are physically mirrored or reversed;
wherein by the reversal in the functionality of said second output signal trace and said inverted portion of said reference plane, orientation of the electromagnetic fields at said second output port is opposed by 180 degrees in phase with respect to the orientation of the electromagnetic fields at said first output port; and
wherein said reversal assures that a signal is split in two different paths and the inversion of the phase of 180 degrees between said first and second output ports is achieved.

15. The balun device of claim 14, wherein said first output microstrip and said second output microstrip have approximately identical length and area.

16. The balun device of claim 15, having typically a phase tolerance better than or equal to +/−10 degrees at said bandwidth and a power range of at least 100 watts.

17. The balun device of claim 14, wherein:
said input microstrip and said first output microstrip are approximately orthogonal;
said input microstrip and said second output are approximately orthogonal; and
said first output microstrip and said second output microstrip are approximately collinear.

18. The balun device of claim 14, wherein:
said reference plane and said inverted portion of said reference plane are each bounded diagonally along an edge;
said diagonal boundaries are approximately parallel;
said diagonal boundaries are in proximity to said T-junction; and
said diagonal boundaries are insulated from said T-junction.

19. The balun device of claim 14, wherein said device is capable of achieving beyond one decade bandwidth.

* * * * *